United States Patent
Kim et al.

(10) Patent No.: US 10,700,164 B2
(45) Date of Patent: Jun. 30, 2020

(54) SEMICONDUCTOR DEVICES

(71) Applicant: SAMSUNG ELECTRONICS CO., LTD., Suwon-si, Gyeonggi-do (KR)

(72) Inventors: Jin-Nam Kim, Anyang-si (KR); Rak-Hwan Kim, Suwon-si (KR); Byung-Hee Kim, Seoul (KR); Jong-Min Baek, Seoul (KR); Sang-Hoon Ahn, Goyang-si (KR); Nae-In Lee, Seoul (KR); Jong-Jin Lee, Seoul (KR); Ho-Yun Jeon, Hwaseong-si (KR); Eun-Ji Jung, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/274,350

(22) Filed: Feb. 13, 2019

(65) Prior Publication Data

US 2019/0189744 A1 Jun. 20, 2019

Related U.S. Application Data

(63) Continuation of application No. 15/632,884, filed on Jun. 26, 2017, now Pat. No. 10,217,820, which is a
(Continued)

(30) Foreign Application Priority Data

Apr. 9, 2015 (KR) .................... 10-2015-0050024

(51) Int. Cl.
*H01L 29/08* (2006.01)
*H01L 23/532* (2006.01)
(Continued)

(52) U.S. Cl.
CPC ...... *H01L 29/0847* (2013.01); *H01L 21/7682* (2013.01); *H01L 21/76834* (2013.01);
(Continued)

(58) Field of Classification Search
None
See application file for complete search history.

(56) References Cited

U.S. PATENT DOCUMENTS 6,376,861 B1  4/2002  Yaegashi et al.
6,869,886 B2  3/2005  Bachmann et al.
(Continued)

FOREIGN PATENT DOCUMENTS

JP  2001230255  8/2001
KR  100257762  6/2000
(Continued)

*Primary Examiner* — Anthony Ho
*Assistant Examiner* — Kevin Quinto
(74) *Attorney, Agent, or Firm* — Myers Bigel, P.A.

(57) ABSTRACT

Semiconductor devices may include a diffusion prevention insulation pattern, a plurality of conductive patterns, a barrier layer, and an insulating interlayer. The diffusion prevention insulation pattern may be formed on a substrate, and may include a plurality of protrusions protruding upwardly therefrom. Each of the conductive patterns may be formed on each of the protrusions of the diffusion prevention insulation pattern, and may have a sidewall inclined by an angle in a range of about 80 degrees to about 135 degrees to a top surface of the substrate. The barrier layer may cover a top surface and the sidewall of each if the conductive patterns. The insulating interlayer may be formed on the diffusion prevention insulation pattern and the barrier layer, and may have an air gap between neighboring ones of the conductive patterns.

20 Claims, 9 Drawing Sheets

Related U.S. Application Data continuation of application No. 15/059,438, filed on Mar. 3, 2016, now Pat. No. 9,728,604.

(51) Int. Cl.
  *H01L 21/768* (2006.01)
  *H01L 23/522* (2006.01)
  *H01L 23/528* (2006.01)
  *H01L 27/088* (2006.01)
  *H01L 27/12* (2006.01)

(52) U.S. Cl.
  CPC .. *H01L 21/76837* (2013.01); *H01L 21/76852* (2013.01); *H01L 21/76862* (2013.01); *H01L 21/76885* (2013.01); *H01L 23/5222* (2013.01); *H01L 23/5283* (2013.01); *H01L 23/53223* (2013.01); *H01L 23/53238* (2013.01); *H01L 23/53266* (2013.01); *H01L 23/53295* (2013.01); *H01L 27/0886* (2013.01); *H01L 27/1211* (2013.01)

(56) References Cited

U.S. PATENT DOCUMENTS

| | | | |
|---|---|---|---|
| 7,557,449 | B2 | 7/2009 | Liu |
| 7,915,064 | B2 | 3/2011 | Cohen et al. |
| 8,541,284 | B2 | 9/2013 | Sim |
| 8,652,972 | B2 | 2/2014 | Fluegge et al. |
| 2002/0031908 | A1 | 3/2002 | Tseng |
| 2003/0176055 | A1 | 9/2003 | Wu |
| 2003/0178656 | A1 | 9/2003 | Kwon et al. |
| 2006/0030101 | A1 | 2/2006 | Shin |
| 2006/0148245 | A1 | 7/2006 | Kim |
| 2007/0224835 | A1 | 9/2007 | Iriguchi |
| 2008/0014736 | A1* | 1/2008 | Kawakita .......... H01L 21/76877 438/597 |
| 2010/0164121 | A1 | 7/2010 | Feustel et al. |
| 2010/0244247 | A1 | 9/2010 | Chang et al. |
| 2011/0309517 | A1 | 12/2011 | Miki et al. |
| 2012/0007165 | A1 | 1/2012 | Lee et al. |
| 2012/0074484 | A1 | 3/2012 | Kang et al. |
| 2012/0261828 | A1* | 10/2012 | Bruce .................. H01L 23/5222 257/774 |
| 2012/0309189 | A1 | 12/2012 | Park et al. |
| 2012/0319279 | A1 | 12/2012 | Isobayashi |
| 2013/0207267 | A1 | 8/2013 | Rho |
| 2014/0175656 | A1 | 6/2014 | Ott et al. |

FOREIGN PATENT DOCUMENTS

| | | |
|---|---|---|
| KR | 1020010081966 | 8/2001 |
| KR | 1020030048606 | 6/2003 |
| KR | 1020050094614 | 9/2005 |
| KR | 1020060013153 | 2/2006 |
| KR | 1020060078849 | 7/2006 |
| KR | 1020070096866 | 10/2007 |
| KR | 1020100108293 | 10/2010 |
| KR | 1020100109173 | 10/2010 |
| KR | 1020120133012 | 10/2012 |
| KR | 1020130092884 | 8/2013 |
| KR | 20130127013 | 11/2013 |

* cited by examiner

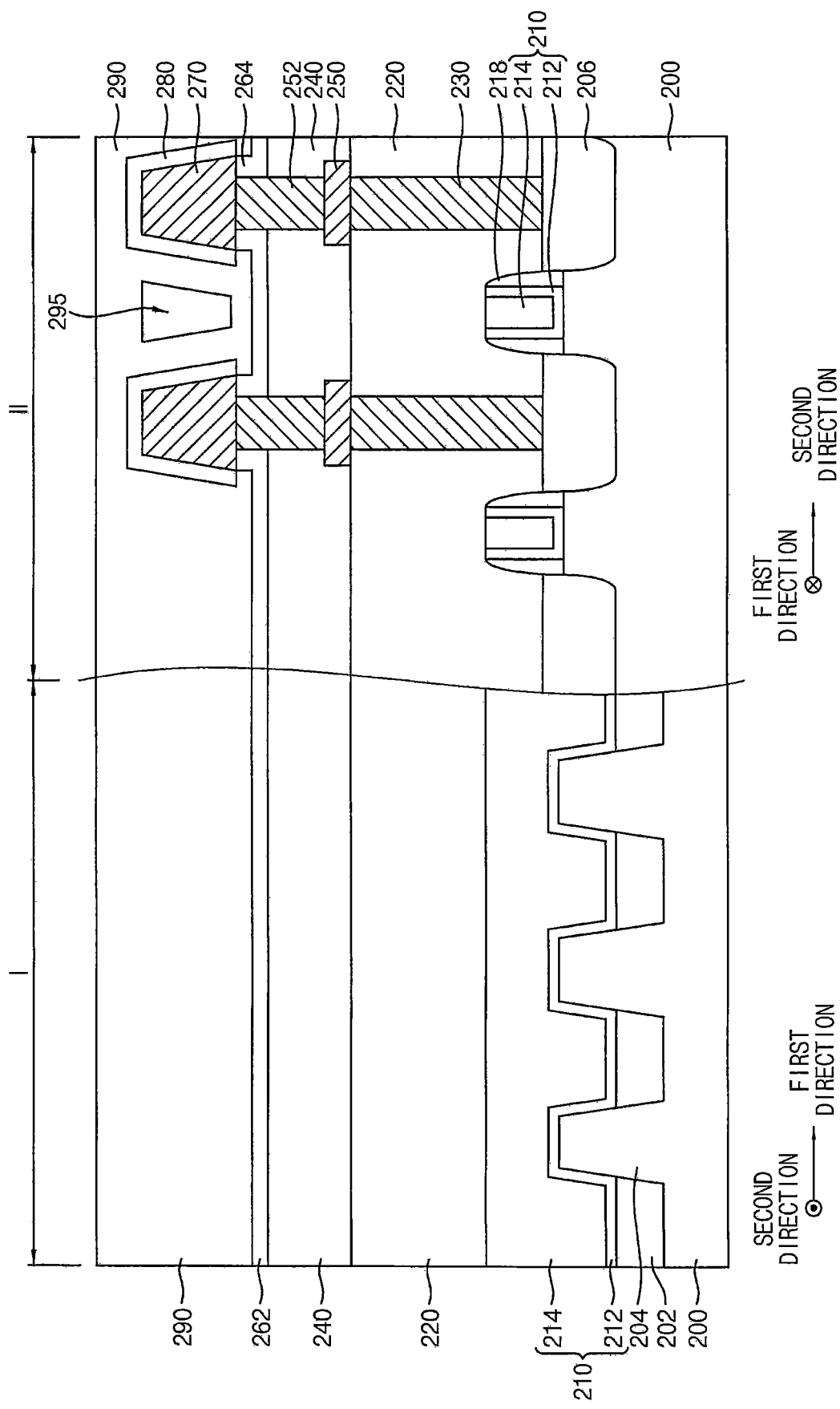

SEMICONDUCTOR DEVICES

CROSS-REFERENCE TO RELATED APPLICATIONS

This application is a continuation application of U.S. patent application Ser. No. 15/632,884, filed Jun. 26, 2017, which is a continuation application of U.S. patent application Ser. No. 15/059,438, filed Mar. 3, 2016, which itself claims priority under 35 U.S.C § 119 to Korean Patent Application No. 10-2015-0050024, filed on Apr. 9, 2015 in the Korean Intellectual Property Office (KIPO), the disclosures of both of which are herein incorporated by reference in their entireties.

BACKGROUND

1. Field

Example embodiments relate to a semiconductor device. More particularly, example embodiments relate to a semiconductor device having a wiring structure.

2. Description of the Related Art

Recently, as the integration degree of a semiconductor device increases, a line width and a pitch of wiring patterns in the semiconductor device have decreased. Accordingly, a parasitic capacitance between the neighboring wiring patterns may increase thereby to cause RC delay and a reduction of an operational speed of the semiconductor device.

SUMMARY

Example embodiments provide a semiconductor device having a reduced parasitic capacitance.

According to example embodiments, a semiconductor device includes a diffusion prevention insulation pattern, a plurality of conductive patterns, a barrier layer, and an insulating interlayer. The diffusion prevention insulation pattern may have a plurality of protrusions protruding upwardly therefrom. Each of the conductive patterns may be formed on each of the protrusions of the diffusion prevention insulation pattern, and may have a sidewall inclined by an angle in a range of about 80 degrees to about 135 degrees to a top surface of the substrate. The barrier layer may cover a top surface and the sidewall of each of the conductive patterns. The insulating interlayer may be formed on the diffusion prevention insulation pattern and the barrier layer, and may have an air gap between neighboring ones of the conductive patterns.

In example embodiments, a width of a top surface of each of the conductive patterns may be smaller than that of a bottom surface thereof.

In example embodiments, a width of a top surface of each of the conductive patterns may be greater than that of a bottom surface thereof.

In example embodiments, a top surface of each of the conductive patterns may be a curve that is convex upwardly.

In example embodiments, a lower sidewall of each of the conductive patterns may be inclined by an angle in a range of about 90 degrees to about 135 degrees to the top surface of the substrate, and an upper sidewall of each of the conductive patterns may be inclined by an angle in a range of about 80 degrees to about 90 degrees to the top surface of the substrate.

In example embodiments, the conductive patterns may include a metal, e.g., copper, aluminum, tungsten, nickel, or the like.

In example embodiments, the barrier layer may include a metal, e.g., tantalum, cobalt, aluminum, manganese, or the like, or a nitride thereof In example embodiments, the barrier layer may include graphene.

In example embodiments, the barrier layer may cover an upper surface of a portion of the diffusion prevention insulation pattern between the neighboring ones of the conductive patterns.

In example embodiments, the insulating interlayer may include silicon carbonitride.

In example embodiments, the diffusion prevention insulation pattern may include silicon nitride, silicon carbonitride, silicon carbide, and/or silicon oxynitride.

According to example embodiments, a semiconductor device includes a diffusion prevention insulation pattern, a plurality of conductive patterns, a catalyst pattern, a gap formation inducing layer, a barrier layer, and an insulating interlayer. The diffusion prevention insulation pattern may be formed on a substrate, and may have a plurality of protrusions protruding upwardly therefrom. Each of the conductive patterns may be formed on each of the protrusions of the diffusion prevention insulation pattern. The catalyst pattern may be formed on each of the conductive patterns. The gap formation inducing layer may be formed on the catalyst pattern, and may have a width greater than that of the catalyst pattern. The barrier layer may cover sidewalls of the conductive patterns and the catalyst patterns, an upper surface of a portion of the diffusion prevention insulation pattern between neighboring ones of the conductive patterns, and the gap formation inducing layers. The insulating interlayer may be formed on the barrier layer, and may have an air gap between the neighboring ones of the conductive patterns.

In example embodiments, the catalyst pattern may include a metal, e.g., cobalt, nickel, tantalum, manganese, or the like.

In example embodiments, the gap formation inducing layer may include a metal nitride, e.g., aluminum nitride, or graphene.

In example embodiments, each of the conductive patterns may have a sidewall inclined by an angle in a range of about 80 degrees to about 135 degrees to a top surface of the substrate.

According to example embodiments, a semiconductor device includes a substrate having an active fin defined by an isolation layer, a gate structure formed on the active fin, a source/drain layer formed on the active fin adjacent to the gate structure, a first insulating interlayer formed on the substrate and covering the gate structure, a diffusion prevention insulation pattern formed on the first insulating interlayer and having a plurality of protrusions protruding upwardly therefrom, a plurality of conductive patterns formed on the protrusions of the diffusion prevention insulation pattern, respectively, and having a sidewall inclined by a given slope, a barrier layer covering a top surface and the sidewall of each of the conductive patterns, and a second insulating interlayer formed on the diffusion prevention insulation pattern and the barrier layer and having an air gap between neighboring ones of the conductive patterns.

In example embodiments, the conductive pattern may include a metal, e.g., copper, aluminum, tungsten, nickel, or the like. The barrier layer may include a metal, e.g., tantalum, cobalt, manganese, or the like, or a nitride thereof.

In example embodiments, the second insulating interlayer may include silicon carbonitride, and the diffusion prevention insulation pattern may include silicon nitride, silicon carbonitride, silicon carbide, or silicon oxynitride.

In example embodiments, the gate structure may include a gate insulation layer pattern and a gate electrode sequentially stacked on the active fin. The gate insulation layer pattern may include a metal oxide having a high dielectric constant, and the gate electrode may include a metal.

In example embodiments, the source/drain layer may include an epitaxial layer including silicon, silicon carbide, or silicon-germanium.

BRIEF DESCRIPTION OF THE DRAWINGS

Example embodiments will be more clearly understood from the following detailed description taken in conjunction with the accompanying drawings. FIGS. 1 to 17 represent non-limiting, example embodiments as described herein.

FIGS. 1 to 5 are cross-sectional views illustrating semiconductor devices, respectively, in accordance with example embodiments;

FIGS. 6 to 10 are cross-sectional views illustrating a method of manufacturing the semiconductor device in FIG. 1 in accordance with example embodiments;

FIGS. 11 and 12 are cross-sectional views illustrating semiconductor devices, respectively, in accordance with example embodiments;

FIGS. 13 to 16 are cross-sectional views illustrating a method of manufacturing the semiconductor device in FIG. 11 in accordance with example embodiments; and FIG. 17 is a cross-sectional view illustrating a semiconductor device in accordance with example embodiments.

DESCRIPTION OF EMBODIMENTS

Figure 1:
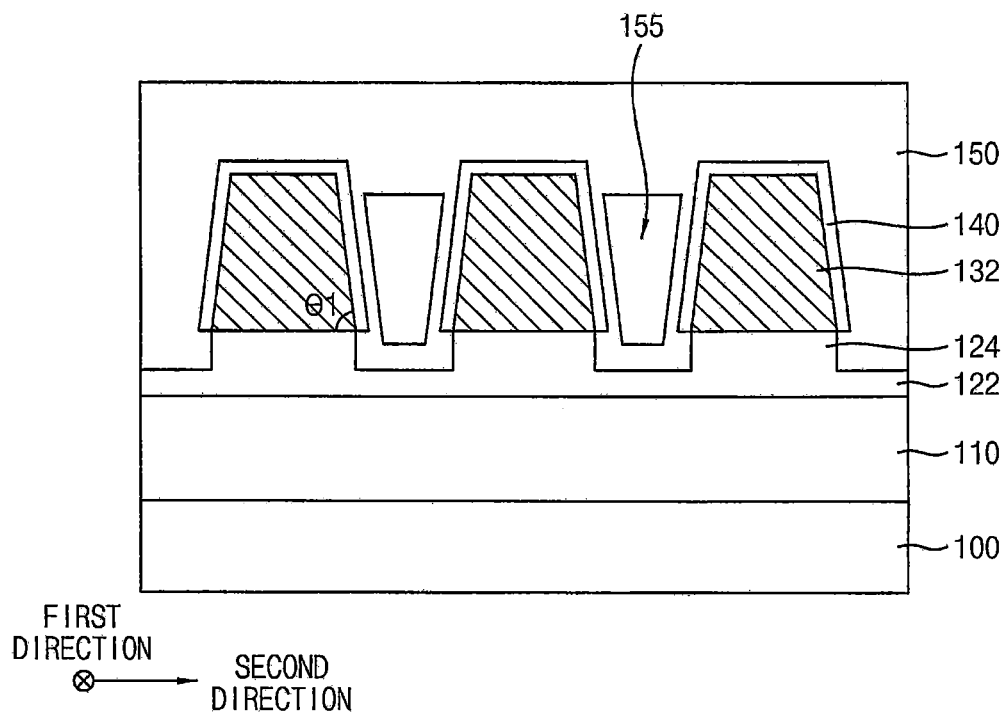
Figure 2:
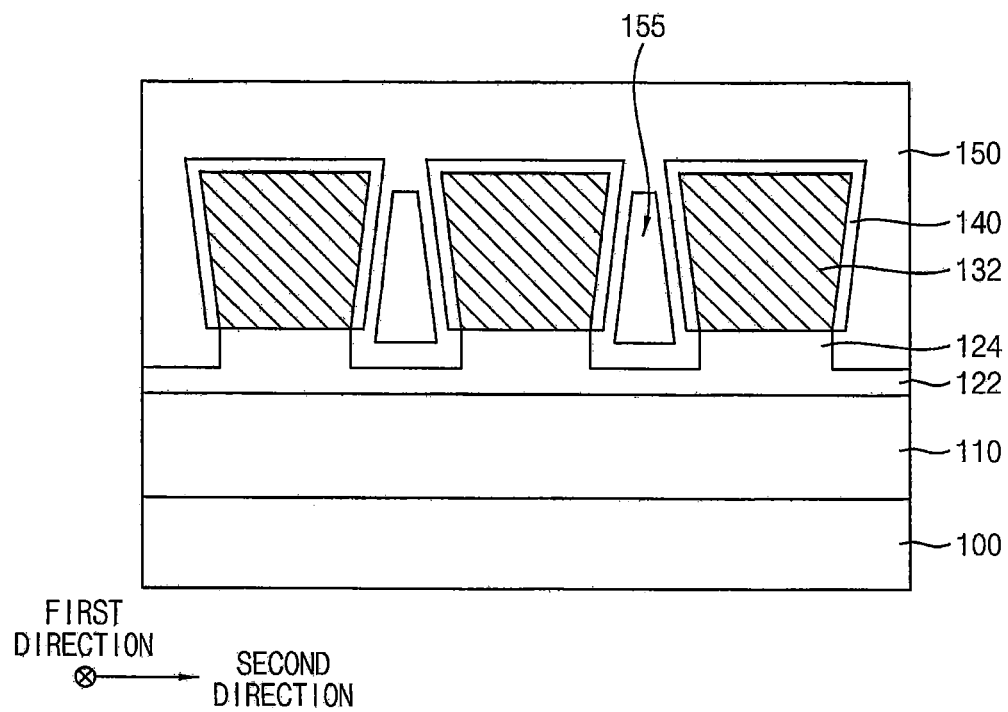

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 5 are cross-sectional views illustrating semiconductor devices according to some example embodiments.

Referring to FIGS. 1 to 5, the semiconductor device may include a first insulating interlayer 110 on a substrate 100, a diffusion prevention insulation pattern 122 on the first insulating interlayer 110, a plurality of conductive patterns 132 on protrusions 124 of the diffusion prevention insulation pattern 122, a barrier layer 140 covering a top surface and a sidewall of each conductive pattern 132, and a second insulating interlayer 150 on the diffusion prevention insulation pattern 122 and the barrier layer 140.

The substrate 100 may include a semiconductor material, e.g., silicon, germanium, silicon-germanium, or the like. In some example embodiments, the substrate 100 may include III-V compound semiconductor, e.g., GaP, GaAs, GaSb, or the like. In some example embodiments, the substrate 100 may include a silicon-on-insulator (SOI) substrate or a germanium-on-insulator (GOI) substrate.

In some example embodiments, the substrate 100 may further include elements that are formed by a front end of line (FEOL) process thereon. The first insulating interlayer 110 may cover the elements. The first insulating interlayer 110 may include an insulating material, e.g., silicon dioxide ($SiO_2$) or a low-k material.

The diffusion prevention insulation pattern 122 on the first insulating interlayer 110 may include a plurality of protrusions 124 protruding upwardly therefrom. Top surfaces of the protrusions 124 may contact bottom surfaces of the conductive patterns 132, respectively, and may possibly prevent metal components contained in the conductive patterns 132 from diffusing toward the first insulating interlayer 110. The diffusion prevention insulation pattern 122 may include, e.g., silicon nitride, silicon carbonitride, silicon carbide, silicon oxynitride, or the like.

In some example embodiments, the plurality of conductive patterns 132 may be arranged in a second direction. Each of the conductive patterns 132 may extend on each of the protrusions 124 of the diffusion prevention insulation pattern 122 in a first direction substantially perpendicular to the second direction. The conductive patterns 132 may include a metal, e.g., copper, aluminum, tungsten, nickel, or the like. In some example embodiments, the conductive pattern 132 may be electrically connected to the substrate 100 by vias (not illustrated) or contacts (not illustrated) passing through the first insulating interlayer 110.

In some example embodiments, each of the conductive patterns 132 may have a sidewall inclined by a first angle $\theta 1$ to a top surface of the substrate 100. For example, the first angle $\theta 1$ may be in a range of about 80 degrees to about 135 degrees. When the first angle $\theta 1$ is in a range of about 80 degrees to about 90 degrees, a width of a top surface of each of the conductive pattern 132 may be less than that of a bottom surface thereof (Refer to FIG. 1). In some example embodiments, when the first angle $\theta 1$ is in a range of about 90 degrees to about 135 degrees, a width of the top surface of each of the conductive patterns 132 may be greater than that of the bottom surface thereof (Refer to FIG. 2).

Figure 3:
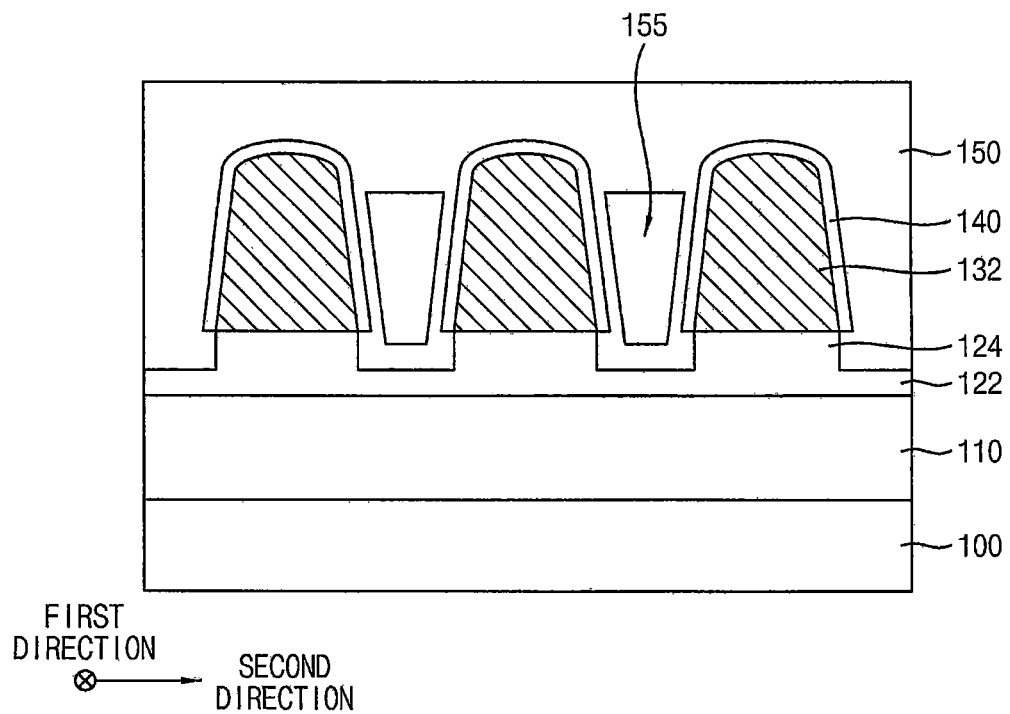

As shown in FIG. 3, the top surface of each of the conductive patterns 132 may have a curved shape that is convex upwardly. In FIG. 3, a top surface of the barrier layer 140 has a curved shape that is convex upwardly, but it is not be limited thereto. For example, the barrier layer 140 may have a top surface substantially parallel to the top surface of the substrate 100.

Figure 4:
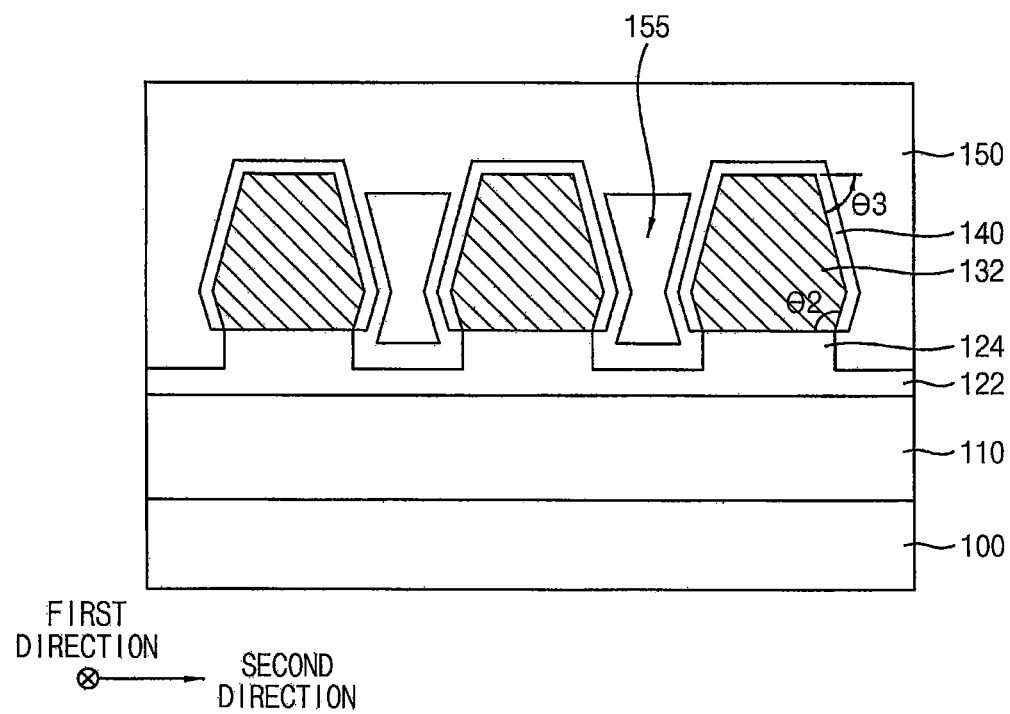

As shown in FIG. 4, each of the conductive patterns 132 may include a sidewall having an undercut shape. In other words, a lower sidewall of each of the conductive patterns 132 may be inclined by a second angle $\theta 2$ to the top surface of the substrate 100, and an upper sidewall of each of the conductive patterns 132 may be inclined by a third angle $\theta 3$ different from the second angle $\theta 2$ to the top surface of the substrate 100. For example, the second angle $\theta 2$ may be in a range of about 90 degrees to about 135 degrees and the third angle $\theta 3$ may be in a range of about 80 degrees to about 90 degrees. FIG. 4 shows that a length of the lower sidewall of each of the conductive patterns 132 is less than that of the upper sidewall thereof, however, the shape of the sidewall of each of the conductive patterns 132 may not be limited thereto. In some example embodiments, the length of the lower sidewall of each of the conductive patterns 132 may be equal to or greater than that of the upper sidewall thereof.

The barrier layer 140 on each of the conductive patterns 132 may extend in the first direction to cover the sidewall and the top surface of the conductive pattern 132. The barrier layer 140 may reduce or possibly prevent the diffusion of metal components contained in the conductive patterns 132 to the second insulating interlayer 150. The barrier layer 140 may include a metal, e.g., tantalum, cobalt, aluminum, manganese, or the like, a metal nitride, e.g., tantalum nitride, cobalt nitride, aluminum nitride, manganese nitride, or the like, or graphene.

In some example embodiments, the barrier layer 140 may cover a portion of the diffusion prevention insulation pattern 122 between neighboring ones of the conductive patterns 132 in the second direction.

Figure 5:
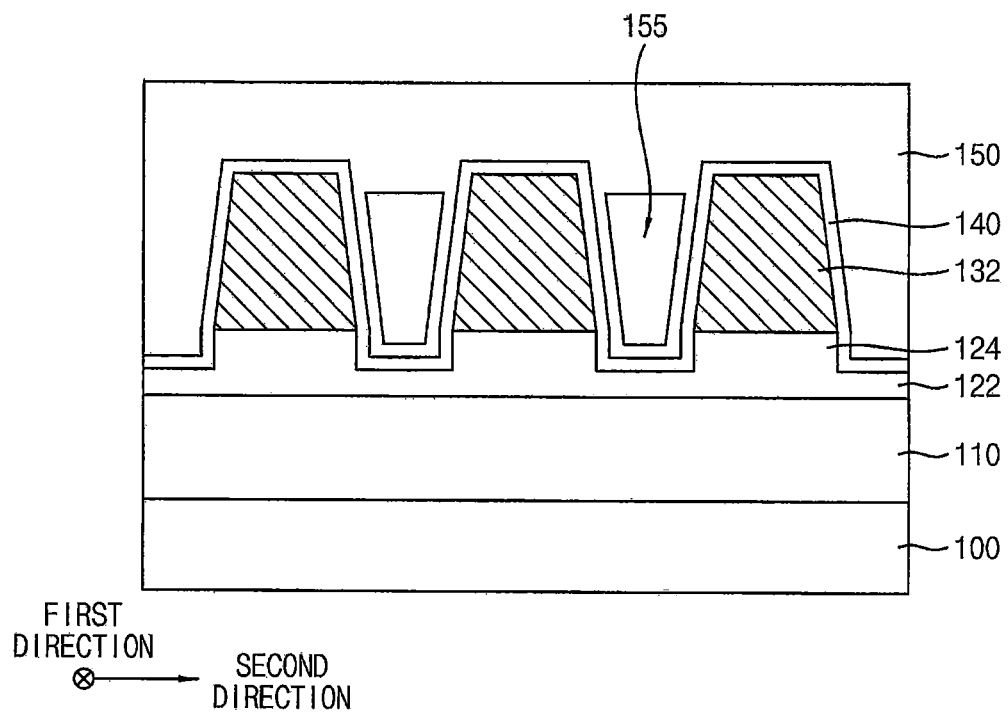

As shown in FIG. 5, the barrier layer 140 may cover the top surface and the sidewall of the conductive pattern 132, and further extend in the second direction to cover a sidewall and an upper surface of the diffusion prevention insulation pattern 122. The neighboring ones of the conductive patterns 132 in the second direction may be connected to each other by the barrier layer 140. In this case, the barrier layer 140 may include an insulation material, e.g., silicon nitride, silicon carbonitride, silicon carbide, silicon oxynitride, or the like, so that the conductive patterns 132 may be electrically insulated from each other.

Referring back to FIG. 1, the second insulating interlayer 150 may be formed on the diffusion prevention insulation pattern 122 and the barrier layer 140, and may cover the plurality of conductive patterns 132. The second insulating interlayer 150 may include a plurality of air gaps 155 therein. Each of the air gaps 155 may be formed between the neighboring ones of the conductive patterns 132 in the second direction. Each of the air gaps 155 may have an air tunnel shape extending in the first direction. FIG. 1 shows that each of the air gaps 155 has a trapezoidal shape in which a width of a top is greater than that of a bottom, however, the shape of the air gaps 155 may not be limited thereto. For example, as shown in FIG. 4, a width of a middle portion of each of the air gaps 155 may be less than those of upper and lower portions thereof.

The air gaps 155 may include air having a relatively low dielectric constant. Accordingly, a parasitic capacitance between the neighboring ones of the conductive patterns 132 adjacent to the air gap 155 may be reduced. It will be understood that "air gap" may be, for example, any void or cavity, and may be a gap filled with air (e.g., an air-gap), a gap filled with an inert gas or gases (e.g., an inert gas gap), a gap defining a vacuum (e.g., a vacuum gap), etc.

In some example embodiments, the second insulating interlayer 150 may include an oxide, e.g., silicon dioxide ($SiO_2$), or a low-k dielectric material. In some example embodiments, the second insulating interlayer 150 may include a material having a lower dielectric constant and a higher elasticity than those of silicon dioxide ($SiO_2$) so as to form the air gaps 155. For example, the second insulating interlayer 150 may include silicon carbonitride (SiCN).

As illustrated above, the semiconductor device may include the conductive patterns 132 each having the sidewall inclined by the angle in the range of about 80 degrees to about 135 degrees to the top surface of the substrate 100, the diffusion prevention insulation pattern 122 having the plurality of protrusions 124 protruding upwardly, which may contact the bottom surfaces of the conductive patterns 132, the barrier layer 140 covering the top surface and the sidewall of each of the conductive patterns 132. Further, the semiconductor device may include the air gaps 155 between the neighboring ones of the conductive patterns 132. Accordingly, the parasitic capacitance of the semiconductor device may be reduced.

FIGS. 6 to 10 are cross-sectional views illustrating a method of manufacturing the semiconductor device in FIG. 1 in accordance with example embodiments.

Figure 6:
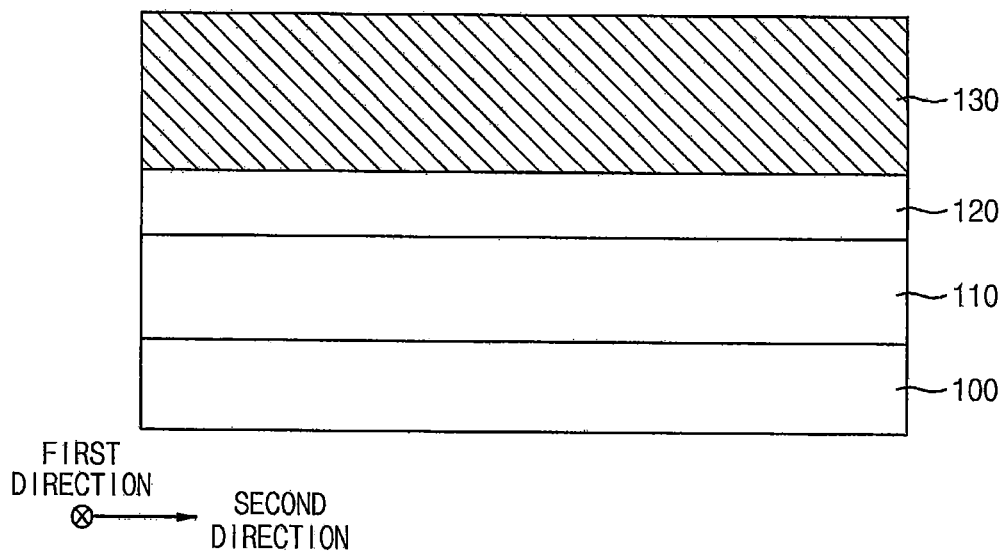

Referring to FIG. 6, a FEOL process may be performed to form elements (not illustrated) on a substrate 100. A first insulating interlayer 110 may be formed on the substrate 100 to cover the elements. A diffusion prevention insulation layer 120 and a conductive layer 130 may be sequentially formed on the first insulating interlayer 110.

Figure 7:
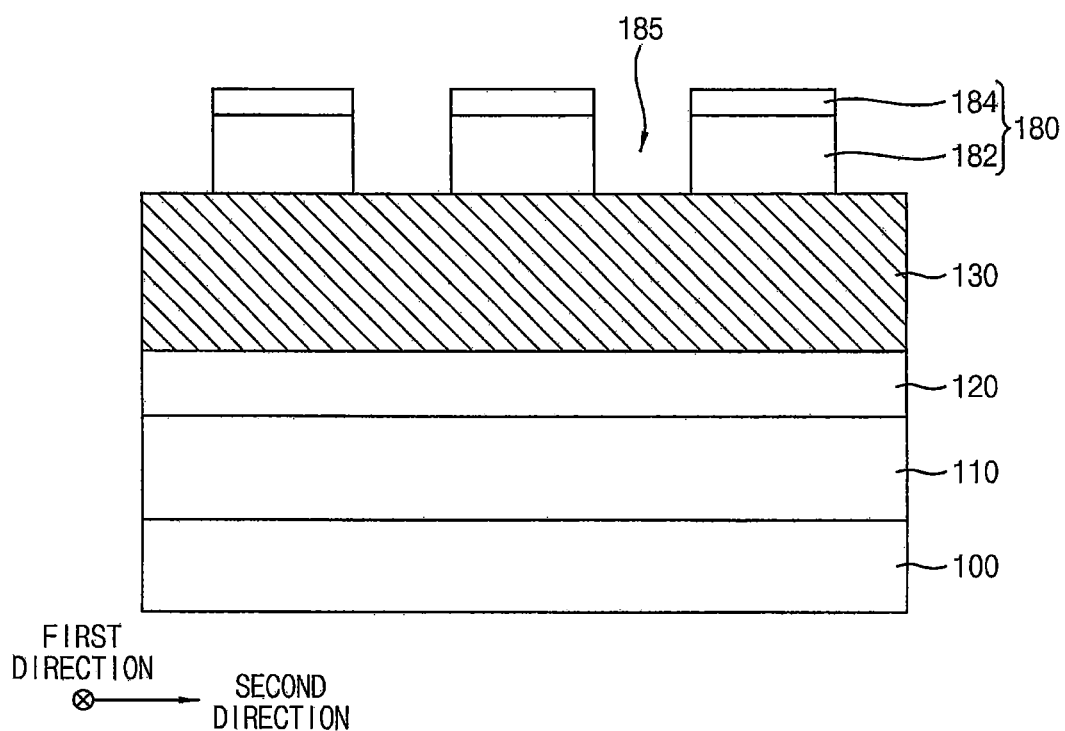

Referring to FIG. 7, a mask structure 180 may be formed on the conductive pattern 130.

In some example embodiments, the mask structure 180 may include a hard mask 182 and a photoresist pattern 184 sequentially stacked. A hard mask layer (not illustrated) and a photoresist layer (not illustrated) may be sequentially formed on the conductive layer 130, and exposure and developing processes may be performed to form the mask structure 180. In some example embodiments, a plurality of mask structures 180 may be formed on the conductive layer 130, which may be spaced apart from each other by first openings 185.

In some example embodiments, the exposure process may be performed using, e.g., chromium fluoride (KrF), argon fluoride (ArF), extreme ultra violet (EUV), vacuum ultra violet (VUV), electron beam, X-ray, ion beam, or the like.

The hard mask 182 may be formed of, e.g., carbon, a silicon-based spin on hard mask (SOH) material, a silicon oxynitride-based hard mask material, or the like. In some example embodiments, the hard mask 182 may not be formed, but the photoresist pattern 184 only may be formed.

Figure 8:
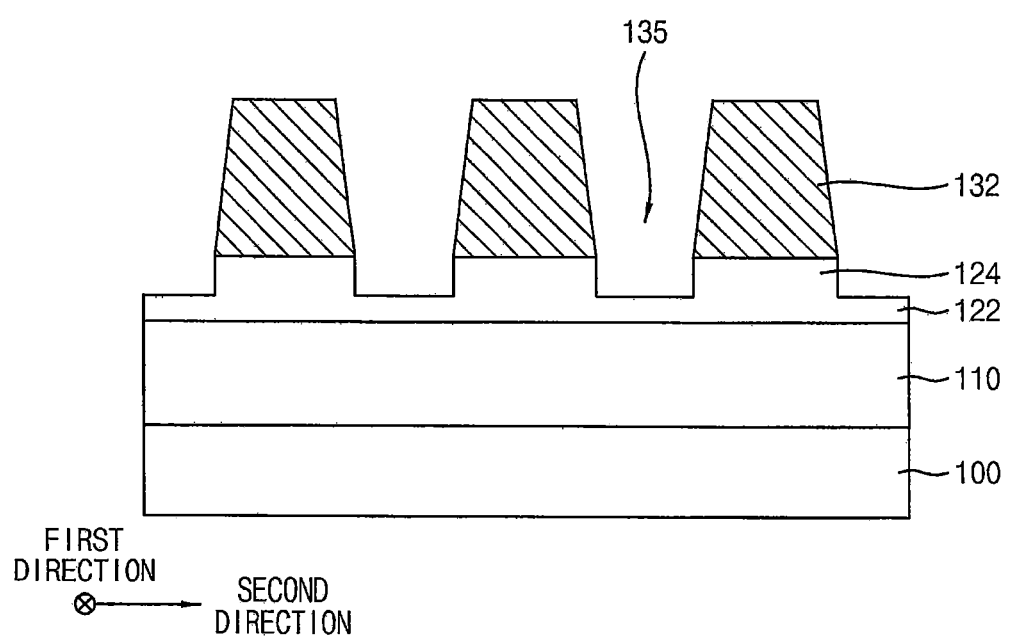

Referring to FIG. 8, the conductive layer 130 may be etched to form a conductive pattern 132.

In some example embodiments, the conductive layer 130 may be etched using the mask structure 180 as an etching mask until a top surface of the diffusion prevention insulation layer 120 may be exposed. Accordingly, a plurality of conductive patterns 132 and second openings 135 may be formed. A sidewall of the conductive pattern 132 may be inclined by an angle in a range of about 80 degrees to about 135 degrees to a top surface of the substrate 100. An upper portion of the diffusion prevention insulation layer 120 may be also partially etched to form a diffusion prevention insulation pattern 122 having a plurality of protrusions 124 at upper portions thereof.

Figure 9:
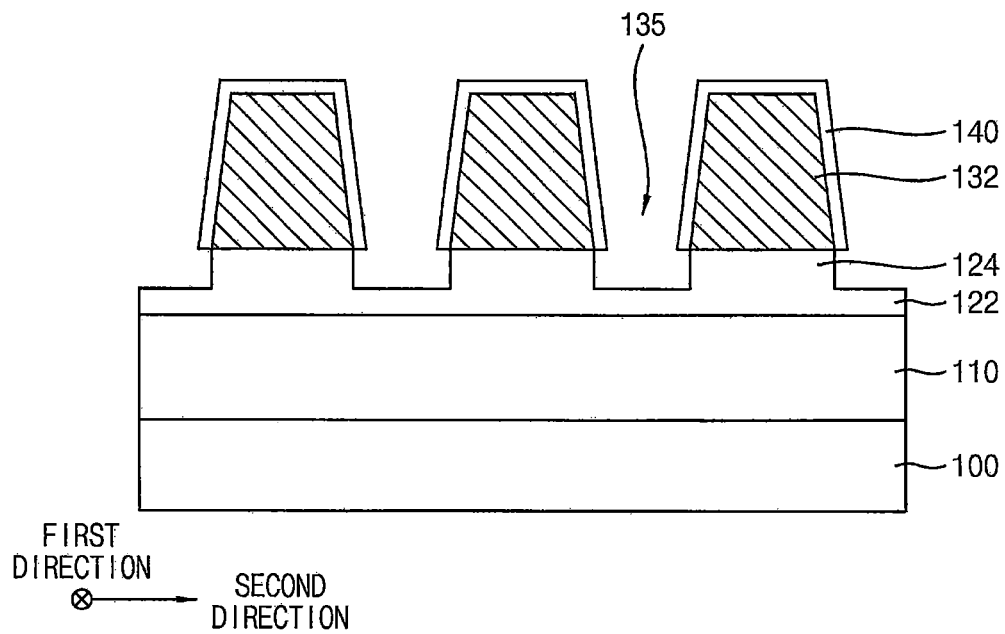

Referring to FIG. 9, a barrier layer 140 may be formed on a top surface and the sidewall of the conductive pattern 132.

In some example embodiments, the barrier layer 140 may be formed on the top surface and the sidewall of the conductive pattern 132 using a material that may be selectively deposited on the conductive pattern 132. The barrier layer 140 may be formed of a metal, e.g., tantalum, cobalt, aluminum, manganese, or the like. In some example embodiments, the barrier layer 140 may be formed of a metal nitride, e.g., tantalum nitride, cobalt nitride, aluminum nitride, manganese nitride, or the like, or graphene. The barrier layer 140 may be formed by, e.g., a chemical vapor deposition (CVD) process.

In some example embodiments, the barrier layer 140 may be formed to fully cover an upper surface of a portion of the diffusion prevention insulation pattern 122 between neighboring ones of the conductive patterns 132 in the second direction. In this case, the barrier layer 140 may be formed of a material substantially the same as or similar to that of the diffusion prevention insulation pattern 122, e.g., silicon nitride, silicon carbonitride, silicon carbide, silicon oxynitride, or the like.

Figure 10:
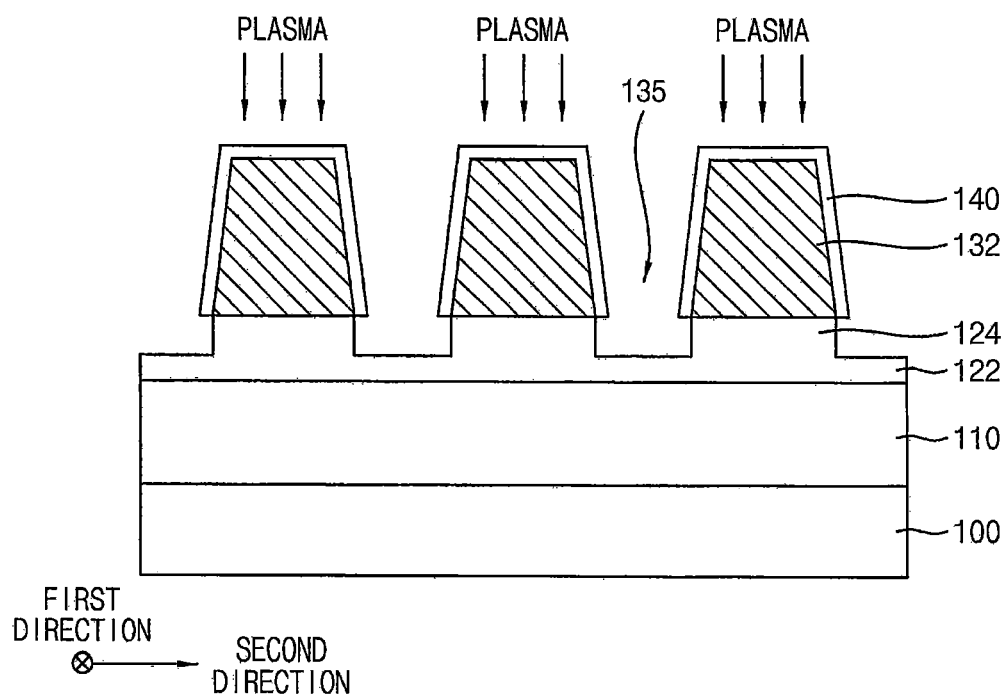

Referring to FIG. 10, a plasma treatment may be performed on an upper surface of the barrier layer 140.

In example embodiments, the plasma treatment may be performed using, e.g., nitrogen plasma, oxygen plasma, hydrogen plasma, mixed plasma including nitrogen and hydrogen, tetrafluoromethane ($CF_4$) plasma, and/or ammonia plasma. The plasma treatment may be performed using a capacitive coupled plasma (CCP) source or an inductively coupled plasma (ICP) source.

When the plasma treatment is performed, a fine film on the upper surface of the barrier layer 140 may be partially removed to form a fine concavo-convex. Thus, the second insulating interlayer 150 may be deposited on the upper surface of the barrier layer 140 better than on the second openings between the neighboring ones of the conductive patterns 132. Accordingly, an air gap 155 may be formed in each of the second openings 135.

Referring back to FIG. 1, a second insulating interlayer 150 may be formed on the diffusion prevention insulation pattern 122 and the barrier layer 140.

In some example embodiments, the second insulating interlayer 150 may be formed under process conditions and using materials having relatively low gap-filling properties. The second insulating interlayer 150 may be formed by, e.g., a plasma enhanced CVD (PECVD) process, a sputtering process, or the like.

Accordingly, the second insulating interlayer 150 may overhang at entrances of the second openings 135 by the conductive patterns 132. Thus, the second insulating interlayer 150 may not completely fill the second openings 135, and the air gap 155 may be formed between the neighboring ones of the conductive patterns 132.

The second insulating interlayer 150 may include a material having a lower dielectric constant and a higher elasticity than those of silicon dioxide ($SiO_2$). For example, the second insulating interlayer 150 may be formed of silicon carbonitride (SiCN).

As described above, in the method of manufacturing the semiconductor device in accordance with example embodiments, the upper surface of the barrier layer 140 may be cleaned by a plasma treatment, and/or the second insulating interlayer 150 having a low gap-filling property may be formed. Accordingly, the air gaps 155 may be formed between the neighboring ones of the conductive patterns 132, and the parasitic capacitance of the semiconductor device may be reduced.

Figure 11:
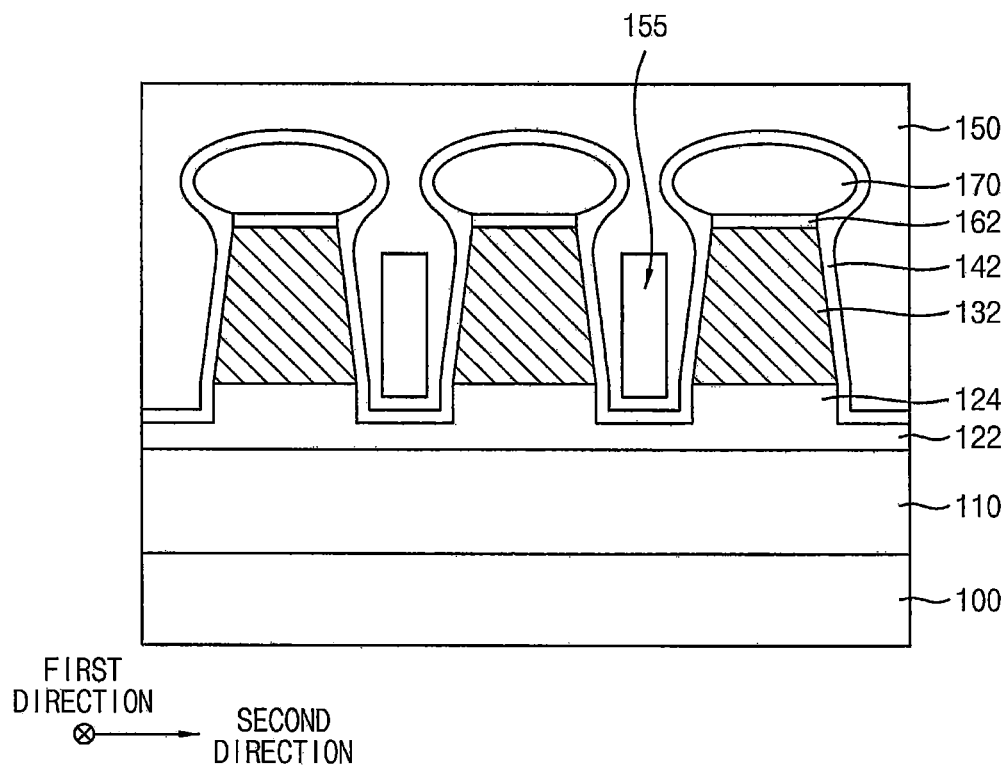
Figure 12:
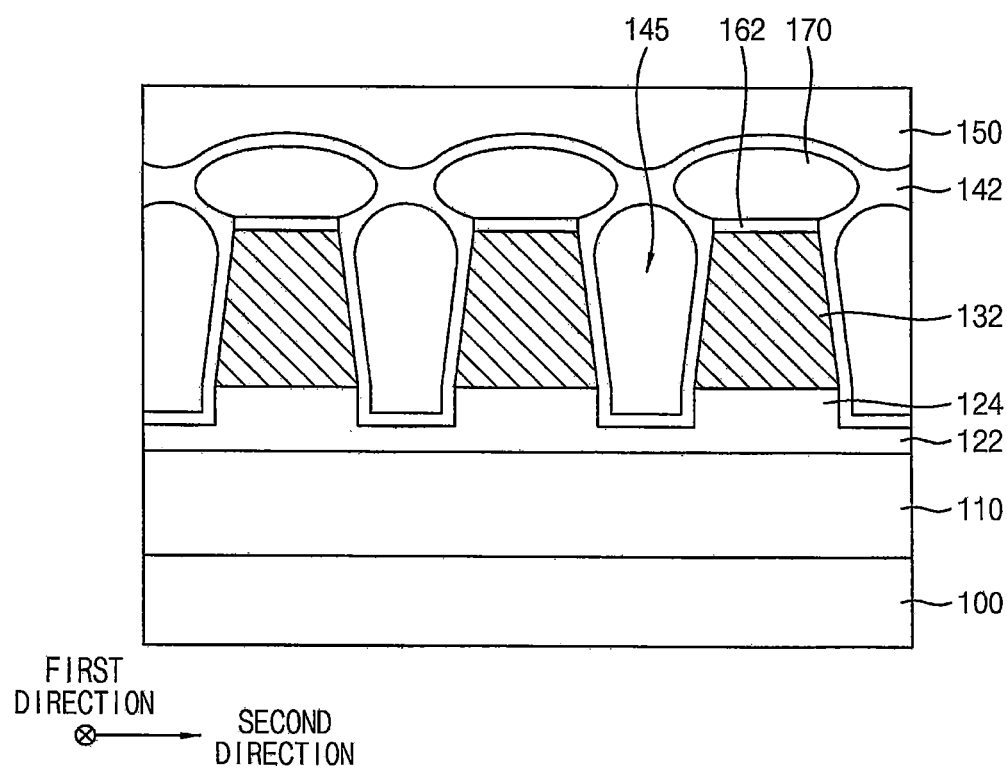

FIGS. 11 and 12 are cross-sectional views illustrating semiconductor devices, respectively, in accordance with example embodiments. The semiconductor device in FIGS. 11 and 12 may be substantially the same as or similar to that illustrated with reference to FIG. 1 except for a catalyst pattern, a gap formation inducing layer, and a shape of a barrier layer. Thus, like reference numerals refer to like elements, and detailed descriptions thereon may be omitted below in the interest of brevity.

Referring to FIGS. 11 and 12, the semiconductor device may include the first insulating interlayer 110 on the substrate 100, the diffusion prevention insulation layer 122 on the first insulating interlayer 110, the plurality of conductive patterns 132 on the protrusions 124 of the diffusion prevention insulation layer 122, respectively, a plurality of catalyst patterns 162 on the conductive patterns 132, respectively, a gap formation inducing layer 170 on each of the catalyst patterns 162, a barrier layer 142 covering the conductive patterns 132, the catalyst patterns 162, the diffusion prevention insulation pattern 122 and the gap formation inducing layer 170, and the second insulating interlayer 150 covering the barrier layer 142. The air gaps 155 may be formed between neighboring ones of the conductive patterns 132 in FIG. 11, and air gaps 145 may be formed between neighboring ones of the conductive patterns 132 in FIG. 12.

Each of the catalyst patterns 162 may extend in the first direction on each of the conductive patterns 132, which may be arranged in the second direction perpendicular to the first direction. The catalyst patterns 162 may include a metal, e.g., cobalt, nickel, tantalum, manganese, or the like.

In some example embodiments, each of the catalyst patterns 162 may fully cover a top surface of each of the conductive patterns 132. In some example embodiments, each of the catalyst patterns 162 may partially cover the top surface of each of the conductive patterns 132.

The gap formation inducing layer 170 may extend in the first direction on each of the catalyst patterns 162, which may be arranged in the second direction. The gap formation inducing layer 170 may include, e.g., aluminum nitride, graphene, or the like.

In some example embodiments, a width of the gap formation inducing layer 170 may be greater than those of each of the catalyst patterns 162 and each of the conductive patterns 132. Accordingly, a gap between neighboring ones of the gap formation inducing layers 170 may be smaller than gaps between neighboring ones of the catalyst patterns 162 and between neighboring ones of the conductive patterns 132.

FIG. 11 shows that the gap formation inducing layer 170 has an elliptical-shaped cross-section, however, the shape of the gap formation inducing layer 170 may not be limited thereto. For example, a top surface of the gap formation inducing layer 170 may be parallel to a top surface of the substrate 100. In some example embodiments, the gap formation inducing layer 170 may have a rectangular-shaped cross-section.

The barrier layer 142 may cover sidewalls of the conductive patterns 132 and the catalyst patterns 162, an upper surface of the diffusion prevention insulation layer 122, and the gap formation inducing layers 170. The barrier layer 142 may reduce or possibly prevent the diffusion of metal component contained in the conductive patterns 132 to the second insulating interlayer 150. The barrier layer 142 may include, e.g., silicon nitride, silicon carbonitride, silicon carbide, silicon oxynitride, or the like.

As shown in FIG. 12, in some example embodiments, the barrier layer 142 may extend in the first direction to cover top surfaces of the gap formation inducing layers 170. Accordingly, the air gap 145 may be formed between the neighboring ones of the conductive patterns 132 by the barrier layer 142. FIG. 12 shows that the air gap 145 has a door-shaped cross-section, however, the shape of the air gap 145 may not be limited thereto, and the air gap 145 may have various shapes.

In this case, the second insulating interlayer 150 may be formed on the barrier layer 142, and may include no air gap therein.

FIGS. 13 to 16 are cross-sectional views illustrating a method of manufacturing the semiconductor device in FIG. 11 in accordance with example embodiments. The semiconductor device in FIGS. 13 to 16 may be substantially the same as or similar to that illustrated with reference to FIGS. 6 to 10 except for a catalyst pattern, a gap formation inducing layer, and a shape of a barrier layer. Thus, like reference numerals refer to like elements, and detailed descriptions thereon may be omitted below in the interest of brevity.

First, processes substantially the same as or similar to those illustrated with reference to FIG. 6 may be performed, so that the first insulating interlayer 110, the diffusion prevention insulation layer 120, and the conductive layer 130 sequentially stacked on the substrate 100 may be formed.

Figure 13:
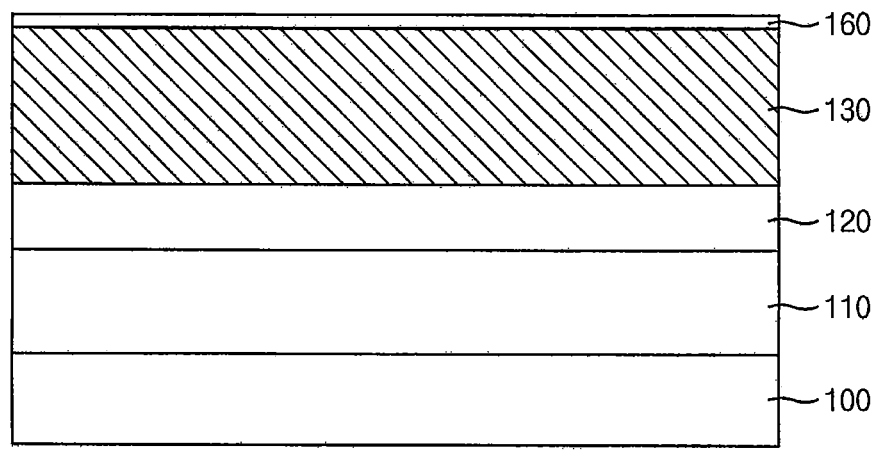

Referring to FIG. 13, a catalyst layer 160 may be formed on the conductive layer 130.

In some example embodiments, the catalyst layer 160 may be formed of a metal, e.g., cobalt, nickel, tantalum, manganese, or the like.

Figure 14:
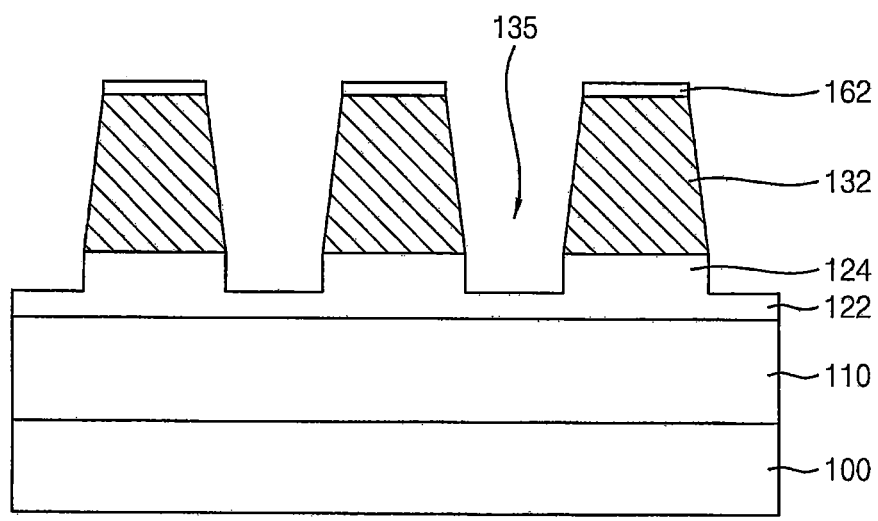

Referring to FIG. 14, a process substantially the same as or similar to that illustrated with reference to FIG. 7 may be performed, so that a mask structure (not illustrated) may be formed on the catalyst layer 160. The catalyst layer 160 and the conductive layer 130 may be etched using the mask structure as an etching mask to form a catalyst pattern 162 and the conductive pattern 132, respectively. In some example embodiments, a plurality of catalyst patterns 162 and the plurality of conductive patterns 132 may be formed. The second opening 135 may be formed between structures including the catalyst layer 160 and the conductive layer 130.

Similar to the process described with reference to FIG. 8, the conductive pattern 132 may be formed to have the sidewall inclined by the angle in a range of about 80 degrees to about 135 degrees to the top surface of the substrate 100. Accordingly, a top surface of the diffusion prevention insulation layer 120 may be partially removed to form the diffusion prevention insulation pattern 122 having the protrusion 124 at upper portions thereof.

Figure 15:
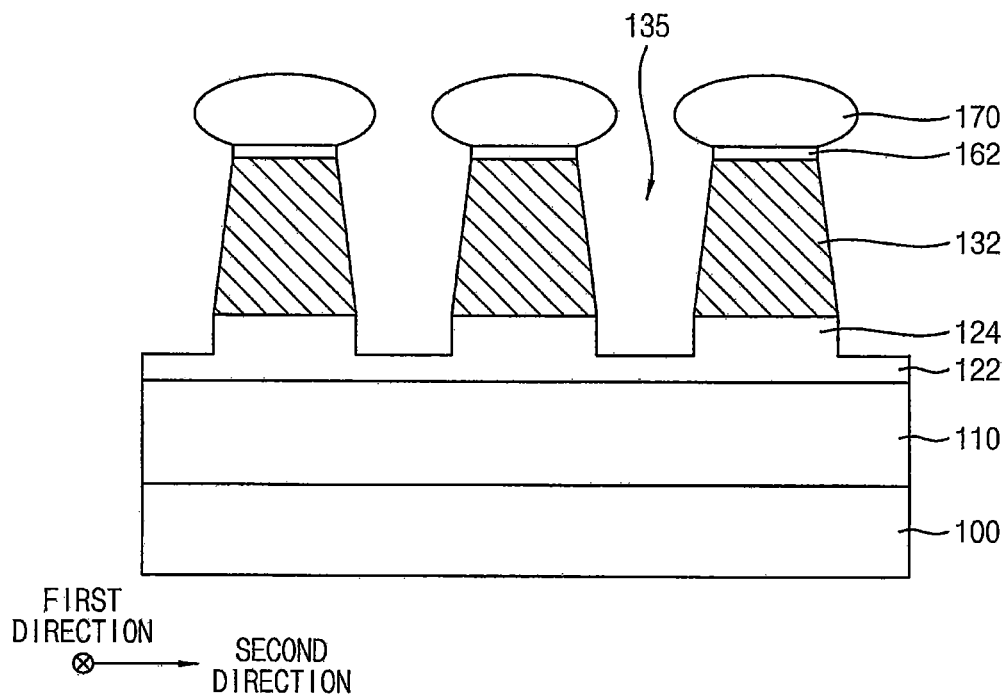

Referring to FIG. 15, a gap formation inducing layer 170 may be formed on the catalyst pattern 162.

In some example embodiments, a width of the gap formation inducing layer 170 may be greater than those of the catalyst pattern 162 and the conductive pattern 132. Accordingly, a gap between neighboring ones of the gap formation inducing layers 170 may be less than gaps between neighboring ones of the catalyst patterns 162 and between neighboring ones of the conductive patterns 132.

In some example embodiments, the gap formation inducing layer 170 may be formed using a material that may be deposited selectively only on a metal component of the catalyst pattern 162. For example, the gap formation inducing layer 170 may be formed using aluminum nitride or graphene by a CVD process.

Figure 16:
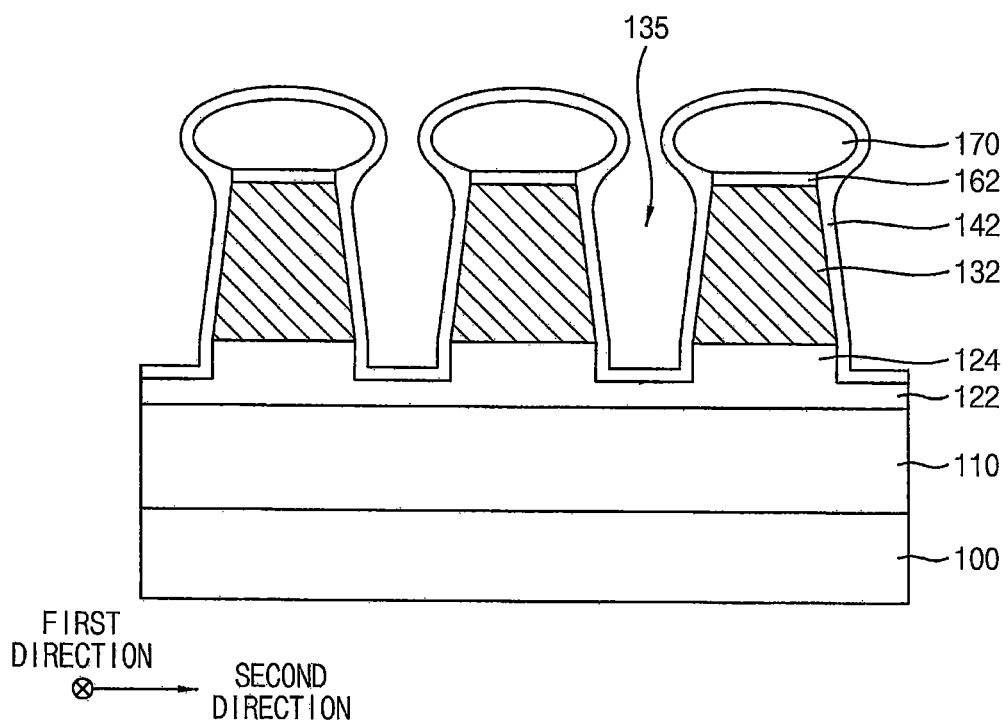

Referring to FIG. 16, a barrier layer 142 may be formed to cover sidewalls of the conductive patterns 132 and the catalyst patterns 162, an upper surface of the diffusion prevention insulation pattern 122, and the gap formation inducing layers 170.

The barrier layer 142 may be formed of, e.g., silicon nitride, silicon carbonitride, silicon carbide, silicon oxynitride, or the like.

In some example embodiments, the barrier layer 142 may fully cover entrances of the second openings 135 to form air gaps 145 between the neighboring ones of the conductive patterns 132, which is illustrated in FIG. 12.

Referring again to FIG. 11, the second insulating interlayer 150 may be formed on the barrier layer 142.

In some example embodiments, the second insulating interlayer 150 may be formed under process conditions and using a material having relatively low gap-filling properties. The second insulating interlayer 150 may be formed by, e.g., a PECVD process, a sputtering process, or the like.

Accordingly, the second insulating interlayer 150 may overhang at entrances of the second openings 135 by the gap formation inducing layers 170. Accordingly, the second insulating interlayer 150 may not completely fill the second openings 135, and air gaps 155 may be formed between the neighboring ones of the conductive patterns 132.

The second insulating interlayer 150 may be formed of a material having a lower dielectric constant and a higher elasticity than those of silicon dioxide ($SiO_2$). For example, the second insulating interlayer 150 may be formed of silicon carbonitride (SiCN).

Alternatively, the second insulating interlayer 150 may not be formed under the process conditions and using a material having relatively low gap-filling properties. For example, the second insulating interlayer 150 may be formed of typical silicon dioxide ($SiO_2$) or a low-k material. In this case, entrances of the second openings 135 may be narrowed by the gap formation inducing layers 170, so that the air gaps 155 may be formed.

As illustrated above, in the method of manufacturing the semiconductor device, the gap formation inducing layers 170 may be formed on the conductive pattern 132. A width of each of the gap formation inducing layers 170 may be greater than that of each of the conductive patterns 132. Accordingly, the air gaps 155 may be formed between neighboring ones of the conductive patterns 132, and the parasitic capacitance of the semiconductor device may be reduced.

FIG. 17 is a cross-sectional view illustrating a semiconductor device in accordance with example embodiments. FIG. 17 shows that the semiconductor device includes a fin-type field effect transistor (finFET), however, the semiconductor device may not be limited thereto.

Referring to FIG. 17, the semiconductor device may include the finFET on a substrate 200, and a plurality of conductive patterns 270 electrically connected to the finFET. A first region I may illustrate a partial cross-sectional view of the semiconductor device taken along a first direction, and a second region II may illustrate a partial cross-sectional view of the semiconductor device taken along a second direction substantially perpendicular to the first direction.

The substrate 200 may include a semiconductor material, e.g., silicon, germanium, silicon-germanium, or the like. In some example embodiments, the substrate 200 may include a III-V compound semiconductor, e.g., GaP, GaAs, GaSb, or the like. In some example embodiments, the substrate 200 may include a SOI substrate or a GOI substrate.

The finFET may include a gate structure 210 and a source/drain layer 206.

Particularly, the substrate 200 may include a field region where a top surface is covered by an isolation layer 202, and an active region where a top surface is not covered by the isolation layer 202. The active region may have a fin-like shape protruding upwardly from the substrate 200. Thus, hereinafter, the active region having fin-like shape may be referred to as an active fin 204.

In some example embodiments, a plurality of active fins 204 may be arranged in the first direction substantially parallel to a top surface of the substrate 200. Each of the active fins 204 may extend in the second direction parallel to the top surface of the substrate 200 and substantially perpendicular to the first direction.

The isolation layer 202 may include an oxide, e.g., silicon oxide.

A plurality of gate structures 210 may be arranged in the second direction. Each of the gate structure 210 may cover the active fin 204 and extend in the first direction.

In some example embodiments, the gate structure 210 may include a gate insulation layer pattern 212 and a gate electrode 214 sequentially stacked on the active fin 204, and the isolation layer 202. The gate structure 210 may further include an interface pattern (not illustrated) between the gate insulation layer pattern 212 and the active fins 204.

The gate insulation layer pattern 212 may include a metal oxide having a high dielectric constant that is higher than that of silicon oxide, e.g., hafnium dioxide ($HfO_2$), tantalum oxide ($Ta_2O_5$), zirconium oxide ($ZrO_2$), or the like. The gate electrode 214 may include a low resistance metal, e.g., aluminum, copper, tantalum, or the like, or a nitride thereof.

A spacer 218 may cover a sidewall of the gate structure 210. The spacer 218 may include a nitride, e.g., silicon nitride.

The source/drain layer 206 may be formed on the active fin 204 adjacent to the gate structure 210. The source/drain layer 206 may include impurities.

The source/drain layer 206 may include an epitaxial layer including, e.g., silicon, silicon carbide, silicon-germanium, or the like. The epitaxial layer may be formed by a selective epitaxial growth (SEG) process using the top surface of the substrate 200 as a seed.

A third insulating interlayer 220 and a fourth insulating interlayer 240 may be sequentially formed on the substrate 200. The third insulating interlayer 220 may cover the finFET. For example, the third and fourth insulating interlayers 220 and 240 may include a silicon oxide.

In some example embodiments, the third and fourth insulating interlayers 220 and 240 may include a lower contact plug 230 and an upper contact plug 252 therethrough, respectively. The lower contact plug 230 and the upper contact plug 252 may electrically connect the source/drain layer 206 to the conductive pattern 270. A contact pad 250 may be formed between the lower contact plug 230 and the upper contact plug 252.

The lower contact plug 230 may penetrate through the third insulating interlayer 220, and may electrically connect the source/drain layer 206 to the contact pad 250. The upper contact plug 252 may penetrate through the fourth insulating interlayer 240, and may electrically connect the contact pad 250 to the conductive pattern 270.

A metal wiring may be formed on the fourth insulating interlayer 240 by a back end of line (BEOL) process. For example, the metal wiring may include a fifth insulating interlayer 290 including a plurality of conductive patterns 270, a diffusion prevention insulation pattern 262 covering a bottom surface of each of the conductive patterns 270, a barrier layer 280 covering a top surface and a sidewall of each of the conductive patterns 270, and an air gap 295 between neighboring ones of the conductive patterns 270.

The diffusion prevention insulation pattern 262 may be formed on the fourth insulating interlayer 240, and may have a plurality of protrusions 264 protruding upwardly therefrom. Each of the protrusions 264 may contact a bottom surface of each of the conductive patterns 270, and may reduce or possibly prevent the diffusion of metal components contained in the conductive patterns 270 to the fourth insulating interlayer 240. The diffusion prevention insulation pattern 262 may include, e.g., silicon nitride, silicon carbonitride, silicon carbide, silicon oxynitride, or the like.

The plurality of conductive patterns 270 may be arranged in the second direction. Each of the conductive patterns 270 may extend on each of the protrusions 264 of the diffusion prevention insulation pattern 262 in the first direction. The conductive patterns 270 may include a metal, e.g., copper, aluminum, tungsten, nickel, or the like. The bottom surface of each of the conductive patterns 270 may contact the upper contact plug 252, and may be electrically connected to the source/drain layer 206.

In example embodiments, each of the conductive patterns 270 may include a sidewall inclined by a given slope to the top surface of the substrate 200. For example, the sidewall of each of the conductive patterns 270 may be inclined by an angle in a range of about 80 degrees to about 135 degrees to the top surface of the substrate 200.

In some example embodiments, a slope of a lower sidewall of each of the conductive patterns 270 may differ from that of an upper sidewall thereof. For example, the lower sidewall of each of the conductive patterns 270 may be inclined by an angle in a range of about 90 degrees to about 135 degrees, while the upper sidewall of the conductive pattern 270 may be inclined by an angle in a range of about 80 degrees to about 90 degrees.

Further, the top surface of the conductive pattern 270 may not be parallel to the top surface of the substrate 200. For example, the conductive pattern 270 may have a curved top surface, which may be convex upwardly.

The barrier layer 280 may cover the top surface and the sidewall of each of the conductive patterns 270. The barrier layer 280 may reduce or possibly prevent the diffusion of metal components contained in the conductive patterns 132 to the second insulating interlayer 150. The barrier layer 280 may include a metal, e.g., tantalum, cobalt, aluminum, manganese, or the like. Alternatively, the barrier layer 280 may include a metal nitride, e.g., tantalum nitride, cobalt nitride, aluminum nitride, manganese nitride, or the like, or graphene.

In some example embodiments, the barrier layer 280 may extend in the second direction to fully cover an upper surface of a portion of the diffusion prevention insulation pattern 262 between the neighboring ones of the conductive patterns 270. The barrier layer 280 may include a material substantially the same as that of the diffusion prevention insulation pattern 262. For example, the barrier layer 280 may include silicon nitride, silicon carbonitride, silicon carbide, silicon oxynitride, or the like.

The fifth insulating interlayer 290 may be formed on the diffusion prevention insulation pattern 262 and the barrier layer 280, and may cover the plurality of conductive patterns 270. The fifth insulating interlayer 290 may include a plurality of air gaps 295 therein. Each of the air gaps 295 may be formed between the neighboring ones of the conductive patterns 270. Each of the air gaps 295 may have an air tunnel shape extending in the first direction. The air gaps 295 may include air having a relatively low dielectric constant, and thus a parasitic capacitance between the neighboring ones of the conductive patterns 270 adjacent to the air gaps 295 may be reduced.

As illustrated above, the semiconductor device may include the air gaps 295 between the neighboring ones of the conductive patterns 270. Accordingly, the parasitic capacitance of the semiconductor device may be reduced.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device comprising:
   a diffusion prevention insulation pattern on a substrate, the diffusion prevention insulation pattern comprising a plurality of protrusions protruding upwardly therefrom;
   a plurality of conductive patterns on the plurality of protrusions of the diffusion prevention insulation pattern, each of the plurality of conductive patterns comprising a sidewall, and the sidewall being tapered in a vertical direction;
   a barrier layer covering at least a top surface of each of the plurality of conductive patterns; and
   an insulating interlayer on the plurality of conductive patterns and the barrier layer,
   wherein an air gap is disposed between neighboring ones of the plurality of conductive patterns, and at least a portion of the air gap is disposed below top surfaces of the neighboring ones of the plurality of conductive patterns.

2. The semiconductor device of claim 1, wherein a width of the top surface of each of the plurality of conductive patterns is less than that of a bottom surface thereof.

3. The semiconductor device of claim 2, wherein the sidewall of each of the plurality of conductive patterns is inclined by an angle in a range of 80 degrees to 135 degrees to a top surface of the substrate.

4. The semiconductor device of claim 1, wherein the top surface of each of the plurality of conductive patterns has a convex shape.

5. The semiconductor device of claim 1, wherein the sidewall of each of the plurality of conductive patterns comprises a lower sidewall and an upper sidewall, the lower sidewall of each of the plurality of conductive patterns is inclined by an angle in a range of 90 degrees to 135 degrees to a top surface of the substrate, and the upper sidewall of each of the plurality of conductive patterns is inclined by an angle in a range of 80 degrees to 90 degrees to the top surface of the substrate.

6. The semiconductor device of claim 1, wherein each plurality of conductive patterns comprises at least one of copper, aluminum, tungsten and nickel.

7. The semiconductor device of claim 1, wherein the barrier layer comprises at least one of tantalum, cobalt, aluminum, manganese, and a nitride.

8. The semiconductor device of claim 1, wherein the barrier layer comprises a graphene structure.

9. The semiconductor device of claim 1, wherein the barrier layer covers an upper surface of a portion of the diffusion prevention insulation pattern between the neighboring ones of the plurality of conductive patterns.

10. The semiconductor device of claim 1, wherein the insulating interlayer comprises silicon carbonitride.

11. The semiconductor device of claim 1, wherein the diffusion prevention insulation pattern comprises at least one of silicon nitride, silicon carbonitride, silicon carbide, and silicon oxynitride.

12. A semiconductor device comprising:
a diffusion prevention insulation pattern on a substrate;
a conductive pattern on the diffusion prevention insulation pattern, the conductive pattern comprising a sidewall that is not perpendicular to a top surface of the substrate, wherein the diffusion prevention insulation pattern extends between the substrate and the conductive pattern, and the conductive pattern is separated from the substrate by the diffusion prevention insulation pattern;
a barrier layer on an upper surface of the conductive pattern;
an insulating interlayer on the barrier layer and the conductive pattern; and
an air gap in the insulating interlayer, at least a portion of the air gap being disposed below a top surface of the conductive pattern,
wherein a width of the top surface of the conductive pattern is smaller than that of a bottom surface of the conductive pattern.

13. The semiconductor device of claim 12, wherein the sidewall of the conductive pattern is inclined by an angle in a range of 80 degrees to 135 degrees to the top surface of the substrate.

14. The semiconductor device of claim 12, wherein the sidewall of the conductive pattern comprises a lower sidewall and an upper sidewall, the lower sidewall is inclined by an angle in a range of 90 degrees to 135 degrees to the top surface of the substrate, and the upper sidewall is inclined by an angle in a range of 80 degrees to 90 degrees to the top surface of the substrate.

15. The semiconductor device of claim 12, wherein the barrier layer comprises at least one of tantalum, cobalt, aluminum, manganese, and a nitride.

16. The semiconductor device of claim 12, wherein the conductive pattern comprises a first conductive pattern and a second conductive pattern, the first and second conductive patterns are spaced apart from each other in a horizontal direction that is parallel to the top surface of the substrate, and
wherein the diffusion prevention insulation pattern extends between the substrate and the first and second conductive patterns, and the first and second conductive patterns are separated from the substrate by the diffusion prevention insulation pattern.

17. The semiconductor device of claim 12, wherein the conductive pattern comprises a lower surface facing the substrate, and the lower surface of the conductive pattern contacts the diffusion prevention insulation pattern.

18. A semiconductor device comprising:
a substrate comprising an active fin defined by an isolation layer;
a gate structure on the active fin;
a source/drain layer on the active fin and adjacent to the gate structure;
a first insulating interlayer on the substrate, the first insulating interlayer covering the gate structure;
a diffusion prevention insulation pattern on the first insulating interlayer, the diffusion prevention insulation pattern comprising a plurality of protrusions protruding upwardly therefrom;
a plurality of conductive patterns on the plurality of protrusions of the diffusion prevention insulation pattern, respectively, each of the plurality of conductive patterns comprising a sidewall, and the sidewall being tapered in a vertical direction;
a barrier layer covering at least a top surface of each of the plurality of conductive patterns; and
a second insulating interlayer on the plurality of conductive patterns and the barrier layer,
wherein an air gap is disposed between neighboring ones of the plurality of conductive patterns, and at least a portion of the air gap is disposed below top surfaces of the neighboring ones of the plurality of conductive patterns.

19. The semiconductor device of claim 18, wherein a width of the top surface of each of the plurality of conductive patterns is less than that of a bottom surface thereof.

20. The semiconductor device of claim 19, wherein the sidewall of each of the plurality of conductive patterns is inclined by an angle in a range of 80 degrees to 135 degrees to a top surface of the substrate.

* * * * *